(12) United States Patent
Hong et al.

(10) Patent No.: US 11,851,754 B2
(45) Date of Patent: Dec. 26, 2023

(54) SEALING ARTICLE COMPRISING METAL COATING, METHOD OF MAKING AND METHOD OF USING THE SAME

(71) Applicant: Taiwan Semiconductor Manufacturing Co., Ltd., Hsin-Chu (TW)

(72) Inventors: Peng-Cheng Hong, Taichung (TW); Jun-Liang Pu, Hsin-Chu (TW); W. L. Hsu, Hsin-Chu (TW); Chung-Hao Kao, Hsin-Chu (TW); Chia-Chun Hung, Taichung (TW); Cheng-Yi Wu, Taichung (TW); Chin-Szu Lee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 543 days.

(21) Appl. No.: 15/801,497

(22) Filed: Nov. 2, 2017

(65) Prior Publication Data

US 2019/0093220 A1   Mar. 28, 2019

Related U.S. Application Data

(60) Provisional application No. 62/564,564, filed on Sep. 28, 2017.

(51) Int. Cl.
*C23C 16/44* (2006.01)
*C23C 14/02* (2006.01)
(Continued)

(52) U.S. Cl.
CPC ...... *C23C 16/4409* (2013.01); *B29D 99/0053* (2013.01); *C23C 14/021* (2013.01);
(Continued)

(58) Field of Classification Search
CPC . C23C 16/4409; C23C 14/021; C23C 14/205; C23C 14/34; C23C 18/1875;
(Continued)

(56) References Cited

U.S. PATENT DOCUMENTS 2,199,647 A * 5/1940 Mueller .................. F16L 41/14
277/606
5,126,185 A * 6/1992 Abe et al. .................... 428/157
(Continued)

FOREIGN PATENT DOCUMENTS

CN      101943265 A      1/2011
CN      102623196 A      8/2012
(Continued)

OTHER PUBLICATIONS

JP 55-017705 Sep. 1980, English abstract.*
(Continued)

*Primary Examiner* — Carson Gross
(74) *Attorney, Agent, or Firm* — Duane Morris LLP

(57) ABSTRACT

A sealing article includes a body and a coating layer disposed on at least one surface of the body. The body comprises a polymeric elastomer such as perfluoroelastomer or fluoroelastomer. The coating layer comprises at least one metal. The sealing article may be a seal, a gasket, an O-ring, a T-ring or any other suitable product. The sealing article is resistant to ultra-violet (UV) light and plasma, and may be used for sealing a semiconductor processing chamber.

18 Claims, 10 Drawing Sheets

(51) Int. Cl.
  *C23C 18/18*  (2006.01)
  *B29D 99/00*  (2010.01)
  *C23C 14/34*  (2006.01)
  *C25D 7/04*  (2006.01)
  *H01J 37/32*  (2006.01)
  *C23C 14/20*  (2006.01)
  *B29K 19/00*  (2006.01)
  *C25D 5/56*  (2006.01)
  *C23C 18/28*  (2006.01)
  *C23C 18/24*  (2006.01)
  *C23C 8/30*  (2006.01)
  *C23C 18/20*  (2006.01)
  *C23C 18/30*  (2006.01)

(52) U.S. Cl.
  CPC ............ *C23C 14/205* (2013.01); *C23C 14/34* (2013.01); *C23C 18/1875* (2013.01); *C25D 7/04* (2013.01); *H01J 37/32513* (2013.01); *B29K 2019/00* (2013.01); *C23C 18/2086* (2013.01); *C23C 18/24* (2013.01); *C23C 18/285* (2013.01); *C23C 18/30* (2013.01); *C25D 5/56* (2013.01)

(58) Field of Classification Search
  CPC .. C25D 7/04; B29D 99/0053; B29D 99/0085; H01J 37/32513; F16J 15/12; F16J 15/10; B32B 15/08; H01L 21/0231; H01L 21/02345–02354; H01L 21/26–2686; H01L 21/67115; H01L 21/67213; C08J 7/12; C08J 2327/12–20
  USPC ..... 156/272.2; 277/647; 428/66.4, 421, 422, 428/463
  See application file for complete search history.

(56) References Cited

U.S. PATENT DOCUMENTS

| | | | | |
|---|---|---|---|---|
| 5,749,586 | A | * | 5/1998 | Dove ........................... 277/608 |
| 5,870,526 | A | * | 2/1999 | Aschner .............. C23C 16/4401 |
| | | | | 219/390 |
| 8,367,776 | B2 | * | 2/2013 | Noguchi ................. C08L 27/18 |
| | | | | 526/248 |
| 9,257,172 | B2 | | 2/2016 | Fujiwara et al. |
| 2005/0202233 | A1 | * | 9/2005 | Forrest et al. ............. 428/316.6 |
| 2010/0052263 | A1 | * | 3/2010 | Doane .................... F16J 15/128 |
| | | | | 277/404 |
| 2010/0304065 | A1 | * | 12/2010 | Tomantschger .... C23C 16/0227 |
| | | | | 427/322 |
| 2014/0065758 | A1 | * | 3/2014 | Huang .................... H01L 31/18 |
| | | | | 438/73 |
| 2014/0110903 | A1 | | 4/2014 | Trompenaars |

FOREIGN PATENT DOCUMENTS

| | | | | |
|---|---|---|---|---|
| CN | 103775646 A | | 5/2014 | |
| DE | 4216940 | * | 9/1993 | |
| JP | 55-017705 | * | 9/1980 | ............... F16J 15/12 |

OTHER PUBLICATIONS

DE 4216942, English abstract, Sep. 1993.*
Chang Guining, et al. "Industrial leakage and remediation," China Petrochemical Press, Jun. 30, 2001, pp. 233-243; English abstract provided.
Qiu Dingyang, et al. "Waterproof Sealing Material Production Technology and Construction Application and Quality Inspection Standard Specification Practical Manual", vol. One, Guangzhou Audiovisual Press, Mar. 31, 2004, pp. 345-359, English abstract provided.
Yang Tiejun, "Industry Patent Analysis Report", Intellectual Property Press, May 31, 2014, pp. 196-200; English abstract provided.

* cited by examiner

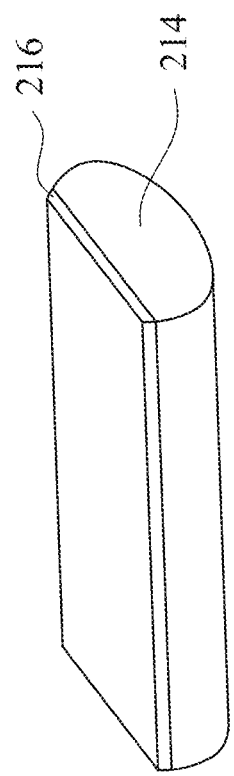
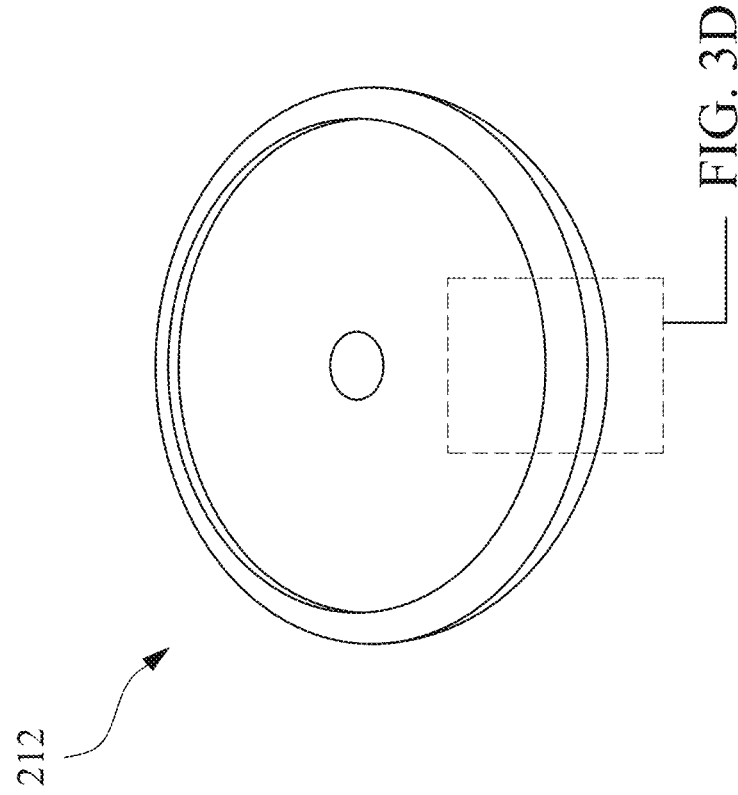
FIG. 3D
FIG. 3C

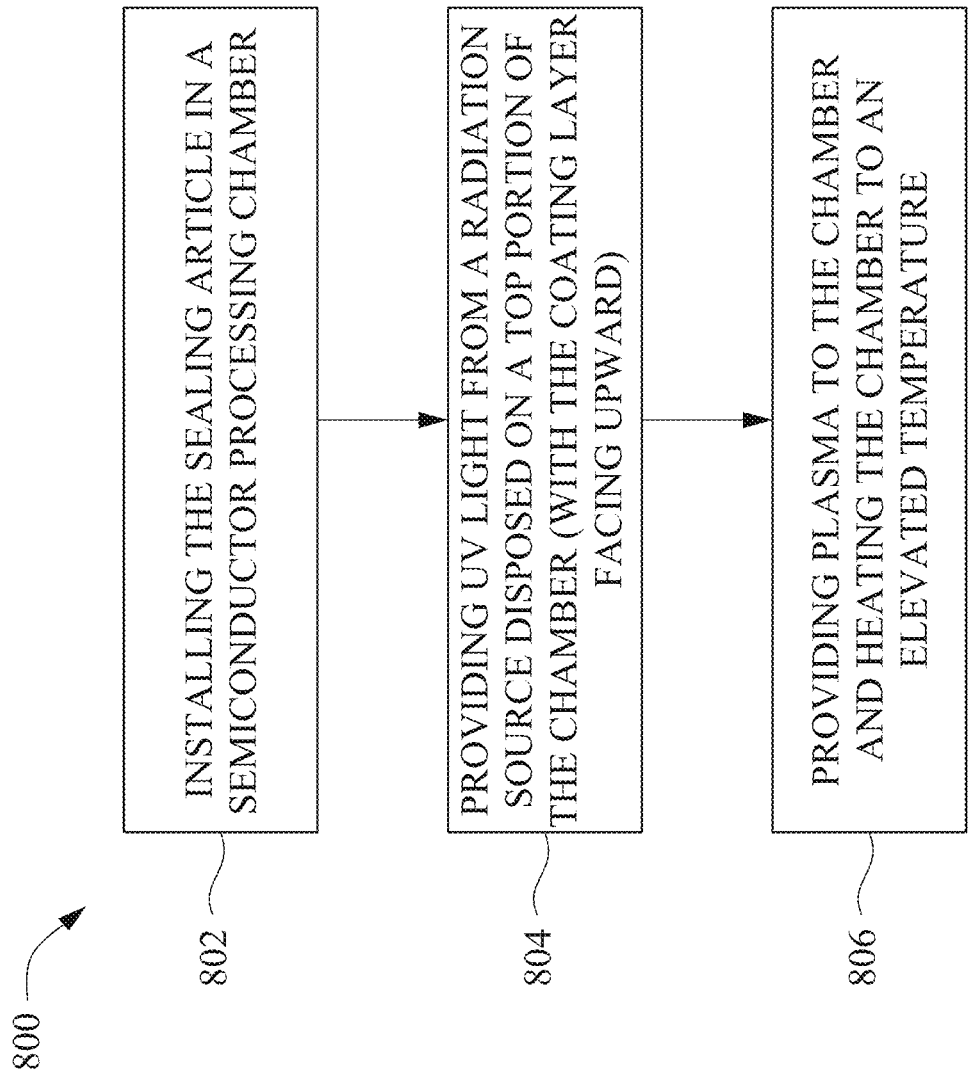

SEALING ARTICLE COMPRISING METAL COATING, METHOD OF MAKING AND METHOD OF USING THE SAME

CROSS-REFERENCE TO RELATED APPLICATION

The present application claims priority to U.S. Provisional Patent Application No. 62/564,564, filed on Sep. 28, 2017, which is incorporated by reference herein in its entirety.

BACKGROUND

This disclosure relates to articles and equipment for semiconductor processing. More particularly, the disclosed subject matter relates to a sealing article used in a processing chamber, the method of making and the method of using such a sealing article.

Semiconductor manufacturing involves the use of various sealed processing chambers in cleanroom environments. Processes such as chemical vapor deposition and plasma deposition require the use of vacuum chambers and similar reactors, in which corrosive chemicals, high-energy plasmas, radiations such as ultra-violet (UV) light are used to create harsh environments. Any contamination such as particles should be avoided inside and outside the processing chambers because the contamination impacts the resulting semiconductor wafers and devices.

Resilient sealing rings made of a polymer material are used for adequately sealing a processing chamber. Such sealing rings are important due to the harsh environments within the processing chamber. The sealing rings maintain the processing chamber in vacuum or under a pressure, keep such chemicals safely within the chamber, and prevent impurities from outside the chamber from entering the chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

FIGS. 3A-3E illustrate an exemplary sealing article in accordance with some embodiments. FIG. 3A is a top view. FIG. 3B is a cross-sectional view normal to an elongated direction. FIG. 3C is a perspective view. FIG. 3D is a perspective view of a portion of the sealing article of FIG. 3C. FIG. 3E is a cross-sectional view of a portion of the sealing article of FIG. 3C along the elongated direction.

FIG. 4A is a top view. FIG. 4B is a cross-sectional view normal to an elongated direction.

FIG. 8 is a flow chart illustrating an exemplary method for using a sealing article in accordance with some embodiments.

DETAILED DESCRIPTION

Figure 1:
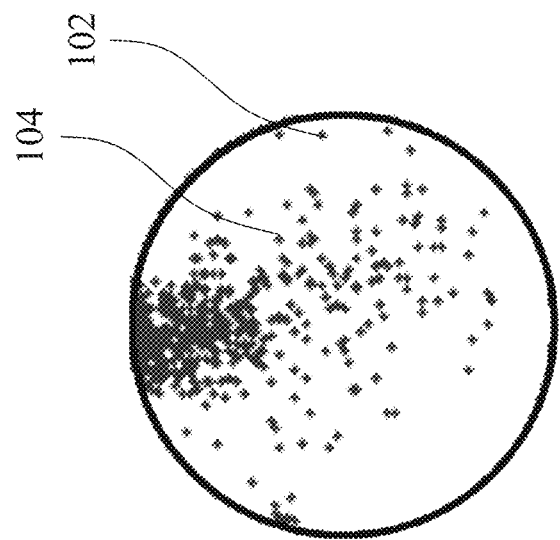
FIG. 1 illustrates a semiconductor substrate having particle contaminations when a sealing article for sealing a processing chamber is damaged by ultra violet (UV) radiation.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a nano structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Like items are indicated by like reference numerals, and for brevity, descriptions of the structure, provided above with reference to the preceding figures, are not repeated.

Ultra violet (UV) radiation is used in various semiconductor processes in a processing chamber. For example, UV is used in photolithography or cleaning processes. A material may be irradiated using UV to generate pores and modify electric properties. For example, modification of electrical properties extends to the reduction of a material's dielectric constant in low-k insulators via exposure to ultraviolet light in UV processing (UVP).

UV can be used in combination with plasma or following a plasma process. Plasmas are defined as a fourth state of matter distinct from solid, liquid or gas and are present in stars and fusion reactors. Gases become plasmas when they are heated until the atoms lose all their electrons, leaving a highly electrified collection of nuclei and free electrons.

Fluorine-containing elastomers, including fluoroelastomers (known as FKMs) and perfluoroelastomers (known as FFKMs) are used in sealing parts in semiconductor processing chambers in some embodiments. Perfluoroelastomers (FFKMs) exhibit good chemical resistance, solvent resistance, plasma resistance, and heat resistance. FFKMs also have high purity.

Referring to FIG. 1, when fluorine-containing elastomers (FKMs or FFKMs) are used for sealing a semiconductor chamber where a semiconductor substrate 102 is processed inside the chamber, sometimes particle contaminations 104 are found on a semiconductor substrate 102. A sealing article for sealing a processing chamber is damaged by ultra violet (UV) radiation to cause the particle contaminations in some embodiments. Chemical analysis of the particle contaminations 104 on the semiconductor substrate (e.g., silicon wafer) indicates the presence of organic residues such as carbon and nitrogen. One of a chemical analysis tool, which can be used, is energy dispersive spectroscopy (EDS). So there is a need for sealing articles having improved resistance to UV and plasma, and such sealing articles can be used in semiconductor processing chambers.

The present disclosure provides a sealing article, a method of making and a method of using the sealing article. The sealing article described herein has excellent resistance to UV and plasma, in addition to other advantages including high temperature resistance, chemical resistance, sealing properties and high purity. The sealing article has a long service life without causing any chemical or particulate contaminations.

Unless expressly indicated otherwise, references to a "fluoroelastomer" or "FKM" made below will be understood to encompass a fluorine-containing co-polymer elastomer comprising at least vinylidene fluoride as a monomer as defined in ASTM D1418, including different composition types with different crosslinking (curing) mechanisms. FKMs include five types based on chemical composition. Type 1 FKMs comprise vinylidene fluoride (VDF) and hexafluoropropylene (HFP). Type 2 FKMs comprise VDF, HFP, and tetrafluoroethylene (TFE). Type 3 FKMs comprise VDF, TFE, and perfluoromethylvinylether (PMVE). Type 4 FKMs comprise propylene, TFE, and VDF. Type 5 FKMs comprise VDF, HFP, TFE, PMVE, and ethylene. Based on crosslinking mechanisms, FKMs can be cured using diamine crosslinking, ionic crosslinking, peroxide crosslinking or any other curing methods.

References to a "perfluoroelastomer" or "FFKM" made below will be understood to encompass an elastomer containing perfluorinated monomers as defined in ASTM D1418. FFKMs comprise moieties from perfluorinated monomers such as TFE and perfluoroalkylvinylether (PAVE) (e.g., PMVE) and at least one perfluorinated cure site monomer (CSM). Examples of a functional group in a CSM include, but are not limited to, a nitrile group, a carboxyl group and an alkoxycarbonyl group. FFKMs can be cured with a curative (crosslinking agent) that reacts with the reactive cure site group on the cure site monomer, and optionally comprise any desired fillers. In some embodiments, FFKMs can be also cured with a peroxide. Such FFKMs may or may not contain any cure site group. The use of a filler or fillers provides targeted mechanical strength, modulus, compression set, improved chemical and/or plasma resistance. FFKMs as described herein can be used at a temperature at least 250° C., for example, up to about 300° C. or 380° C. In some embodiments, a FFKM, other than FKM, is used for better results.

When FFKMs contain cure site monomers having reactive cure site groups, such FFKMs can be cured a curative such as bisamidoxime, bisamidrazone, bisaminophenol, bisaminothiophenol or bisdiaminophenyl compound, which reacts with a nitrile group, a carboxyl group or an alkoxycarbonyl group and form an oxazole ring, a thiazole ring, an imidazole ring or a triazine ring to provide a crosslinked structure. Examples of a suitable curative include, but are not limited to diaminobisphenol AF, 3,3'-diaminobenzidine. 2,2-bis(3,4-diaminophenyl)hexafluoropropane, 2,2-bis[3-amino-4-(N-methylamino)phenyl]hexafluoropropane, 2,2-bis[3-amino-4-(N-ethylamino)phenyl]hexafluoropropane, 2,2-bis[3-amino-4-(N-propylamino)phenyl]hexafluoropropane, 2,2-bis[3-amino-4-(N-phenylamino)phenyl]hexafluoropropane, 2,2-bis[3-amino-4-(N-perfluorophenylamino)phenyl]hexafluoropropane, 2,2-bis[3-amino-4-(N-benzylamino)phenyl]hexafluoropropane, and the like. In some embodiments, 2,2-bis[3-amino-4-(N-phenylamino)phenyl]hexafluoropropane or diaminobisphenol AF is used.

Unless expressly indicated otherwise, references to an "elongated" body shape or direction made below will be understood to distinguish from the shape or direction in the cross-section of a sealing article or its body. For example, when the sealing article or the body has a ring (or loop) or ring-like shape, the elongated direction refers to the circumferential direction of the ring or ring-like shape. The elongated body or direction may not be straight. In some embodiments, the sealing article has a large size, a part of the elongated body may be straightened or folded due to its flexibility. In some embodiments, a sealing article may be a molded part having an elongated body, which can be joined or spliced to form a ring or ring-like sealing article.

Figure 2:
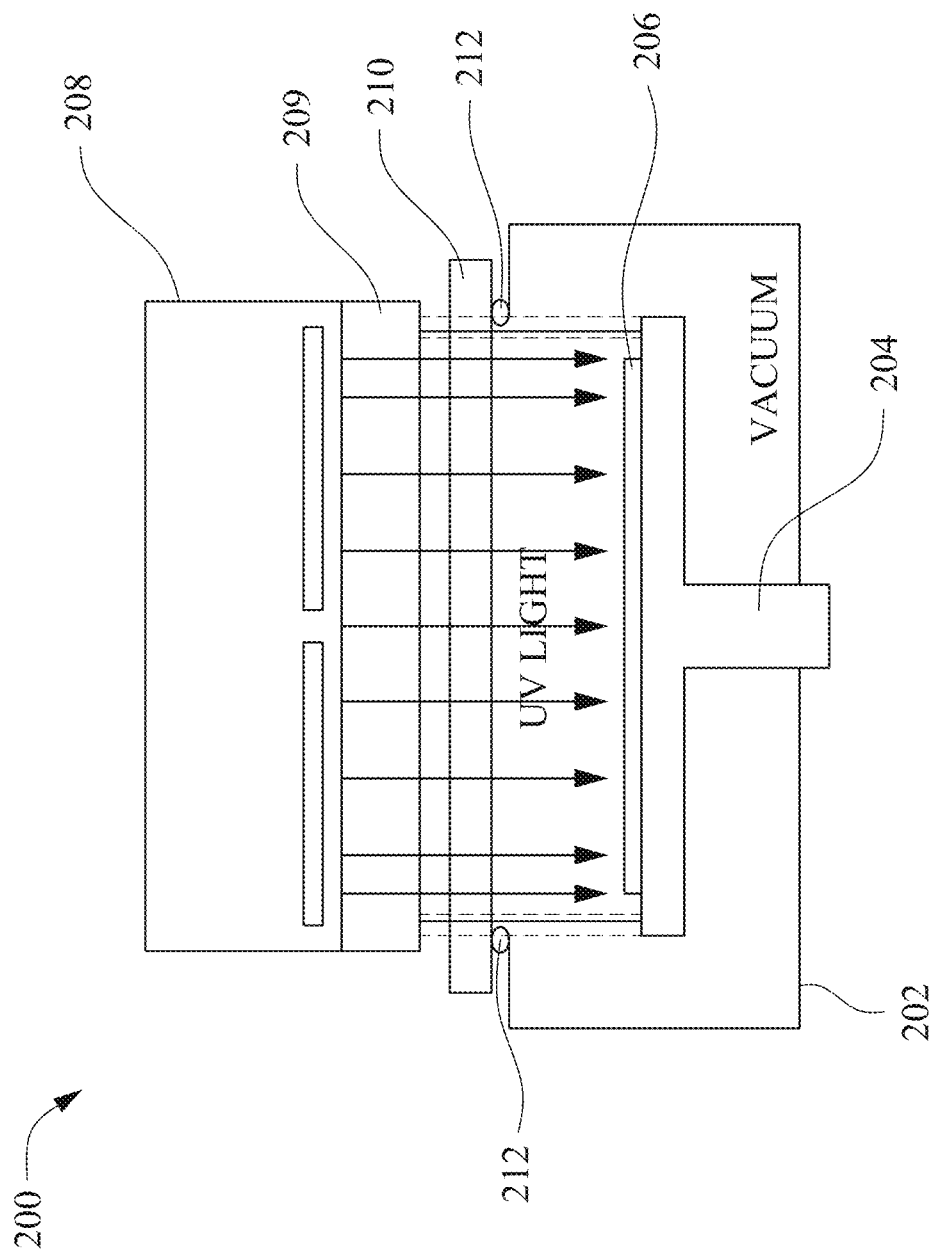
FIG. 2 is a cross-sectional view illustrating an exemplary processing chamber comprising a sealing article in accordance with some embodiments.

Referring to FIG. 2, an exemplary processing chamber 200 (apparatus or system) is illustrated. The exemplary processing chamber 200 comprises a main chamber 202, and a substrate holder 204 for holding a semiconductor substrate 206 disposed inside the main chamber 202. The main chamber 202 may be made of aluminum or aluminum alloys. In some embodiments, the exemplary processing chamber 200 also comprises an auxiliary apparatus 208 disposed above the main chamber 202. The auxiliary apparatus 208 comprises at least one radiation generating source 209. The radiation generating source 209 generates and supplies radiation such as UV light into the main chamber 202 for irradiating the semiconductor substrate 206. A radiation transparent window 210 is disposed between the radiation generating source 209 and the main chamber 202. One example of the radiation transparent window 210 is made of quartz, which is transparent to UV.

The present disclosure provides an exemplary sealing article 212 for sealing the processing chamber 200, for example, sealing the interface between the main chamber 202 and the radiation transparent window 210.

Referring to FIGS. 3A-3E, the exemplary sealing article 212 comprises a body 214 and a coating layer 216 disposed on at least one surface 217 of the body 214. The body 214 comprises a polymeric elastomer such as a fluorine containing elastomer. The coating layer 216 comprises at least one metal or a metal-containing material such as a ceramic. Examples of suitable polymeric elastomer in the body 214 include, but are not limited to, perfluoroelastomer (FFKM), fluoroelastomer (FKM) and combinations thereof at any suitable ratio. Examples of suitable materials for the at least one metal in the coating layer 216 include, but are not limited to, aluminum, copper, gold, silver, and combinations thereof. In some embodiments, the coating layer 216 is made of aluminum. The coating layer 216 has a suitable thickness, for example, in a range of from 10 micrometers to about 10,000 micrometers (e.g., 50 µm to 200 µm).

In some embodiments, the body 214 is made of a perfluoroelastomer (FFKM). The FFKM may comprise a base polymer made from monomers including tetrafluoroethylene and perfluoroalkylvinyl ether. Such a base polymer may be cured with an organic peroxide to form a crosslinked structure in some embodiments. In some other embodiments, the FFKM may comprise a base polymer made from monomers including tetrafluoroethylene, perfluoroalkylvinyl ether, and at least one first cure site monomer having at least one functional group such as nitrile, carboxyl and alkoxycarbonyl. The perfluoroelastomer (FFKM) is a copolymer of a perfluoro(alkyl vinyl ether), tetrafluoroethylene, and the cure site monomer. The FFKM is crosslinked using a suitable curative through reacting the cure site monomer. In some embodiments, the curing (crosslinking) of a perfluoroelastomer containing a function group (e.g., nitrile) may be achieved using a dual cure system of a peroxide catalyzed cure and a catalyst that crosslinks using the functional groups. Fillers are also optionally used in the FFKM composition. Examples of a suitable filler include, but are not limited to, perfluorotetrafluoroethylene (PFTE). FFKM Compounds and/or molded parts are available from companies such as DuPont of Delaware, U.S.A., Greene Tweed Inc. of Pennsylvania, U.S.A., and Precision Polymer Engineering of England.

The exemplary sealing article 212 may be any type, for example, a seal, a gasket, an O-ring, a T-ring, or any combination thereof. The exemplary sealing article 212 may be in a ring or ring-like shape, or has an elongated body, which can be joined or spliced into a ring or ring-like shape. In some embodiments, the sealing article 212 is in a loop configuration, or is sized and shaped to provide a loop configuration, extending along the elongated shape of the body. For example, the exemplary sealing article 212 may be a molded O-ring in some embodiments. Alternatively, the exemplary sealing article 212 may be molded and/or cut into a long strip having a suitable length, and then spliced together to form a long configuration according to the size of the main chamber 202. In some embodiments, the O-ring may have a cross-section having a diameter in a range of from about 2 mm to 5 mm (e.g., from 3 mm to 4 mm).

Figure 3B:
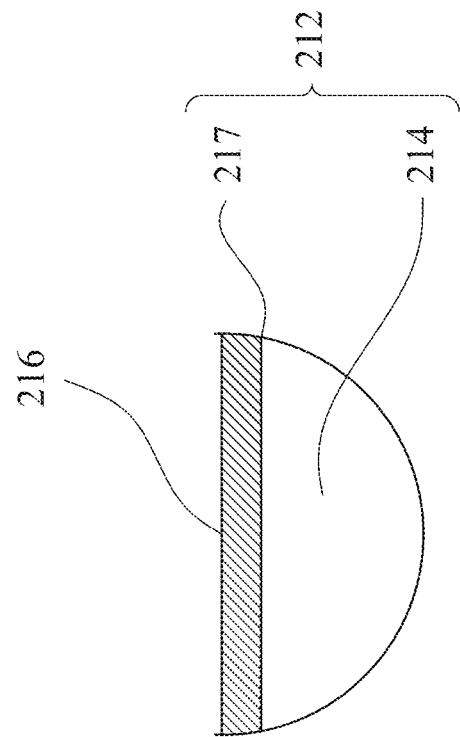
Figure 3A:
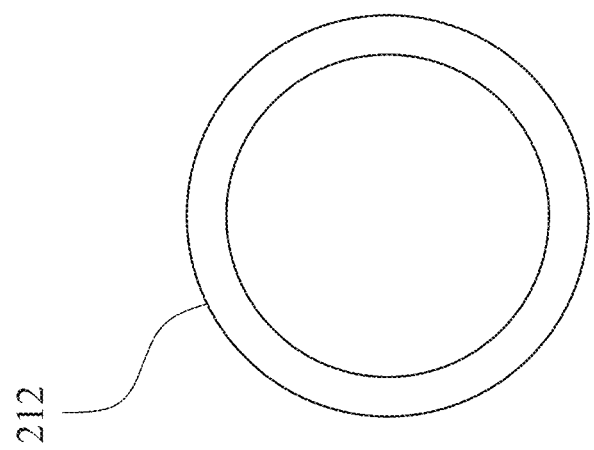

Referring to FIGS. 3B-3D, in some embodiments, the body 214 has a cross-section in a semi-circular or semi-elliptical shape. This cross-section may be in a direction perpendicular to a direction along the elongated shape of the body 214. The coating layer 216 is disposed on a top surface 217 of the body 214. The top surface 217 of the body 214 is coated with the coating layer 216 may be a flat surface of the semi-circular or semi-elliptical shape (FIG. 3B).

Figure 3E:
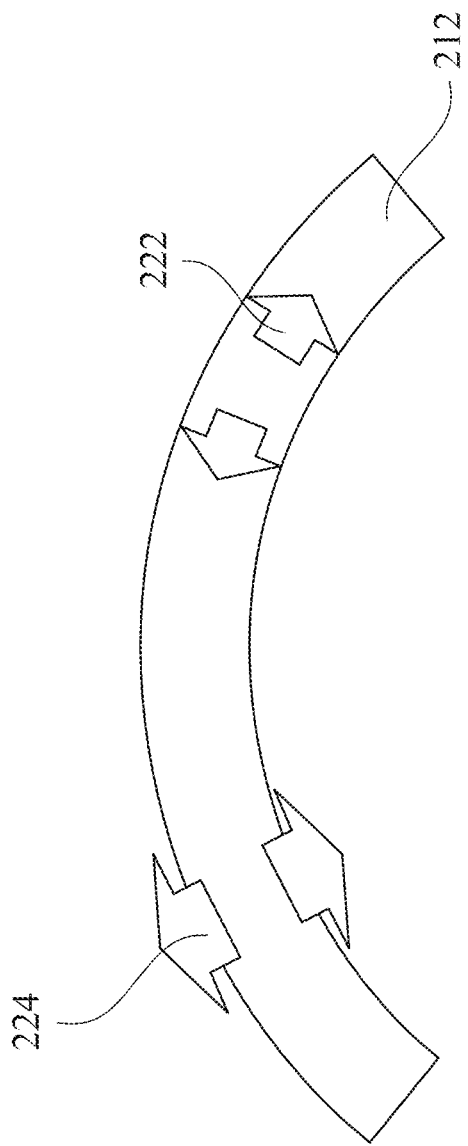

Referring to FIG. 3E, the inventors surprisingly found that the coating layer 216 has excellent adhesion onto the body 214. No flaking or cracking exists. The sealing article 212 still retains flexibility of the body 214. When the sealing article 212 is stretched or squeezed in different directions, for example, along the elongated direction (direction 222 in FIG. 3E) and across the cross-section (direction 224 in FIG. 3E) of the sealing article 212, no cracking has been found.

Figure 4B:
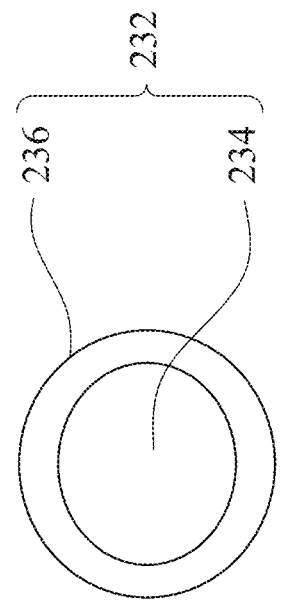
FIGS. 4A-4B illustrate another exemplary sealing article in accordance with some embodiments.
Figure 4A:
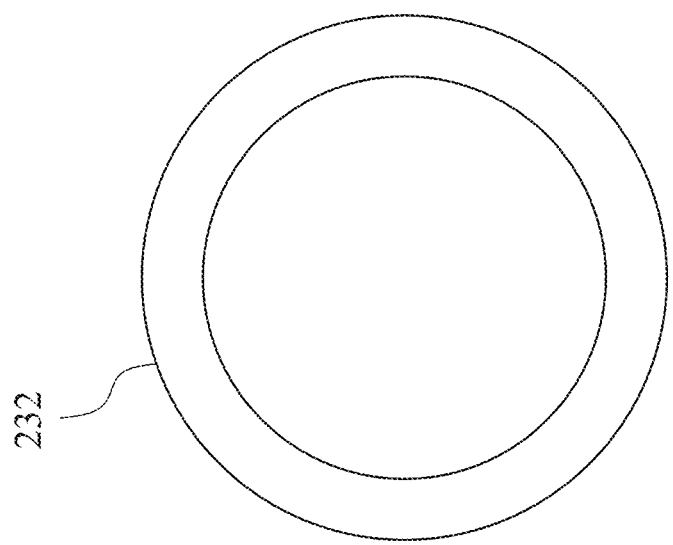

Referring to FIGS. 4A and 4B, another exemplary sealing article 232 is illustrated. References to sealing articles 212 and 232 can be interchangeable. Exemplary sealing articles 212 and 232 differs only in the shape of cross-sections and the area of coating. The descriptions above such as material types for the exemplary sealing article 212 also applies to the exemplary sealing article 232. The descriptions above such as material types for the body 214 and the coating layer 216 in the exemplary sealing article 212 also apply to the body 234 and the coating layer 236 in the exemplary sealing article 232, respectively.

As shown in FIG. 4B, in some embodiments, the body 234 has a cross-section in a circular or elliptical shape, and the coating layer 236 is disposed on and fully covers the external surface of the body 234. In some other embodiments, the coating layer 236 is disposed partially onto the external surface of the body 234. For example, only a half-circular surface of the body 234 is coated with the coating layer 236.

The coating configurations and results described in FIGS. 3B and 4B are for illustration only. The coating layer 216 or 236 may be partially or fully coated on the body 214 or 234. The body 214 or 234 may be in any other suitable cross-sectional shape. The coating layer 216 or 236 may be disposed onto the body 214 or 234 in a pattern in some embodiments. In some embodiments, the exemplary sealing article 212 or 232 is sized, shaped and configured to be installed in the exemplary processing chamber 200 with the coating layer 216 or 236 faced toward the radiation generating source 209. The coating layer 216 or 236 is configured to reflect, and/or absorb the radiation such as UV from the radiation generating source 209. In some embodiments, the exemplary sealing article 212 or 232 can be used in semiconductor processing environments including high plasma (e.g., 300-9,000 watts), high temperature (e.g., 300-600° C.), and/or high energy UV (e.g., 100-400 nm in wavelength).

Figure 5:
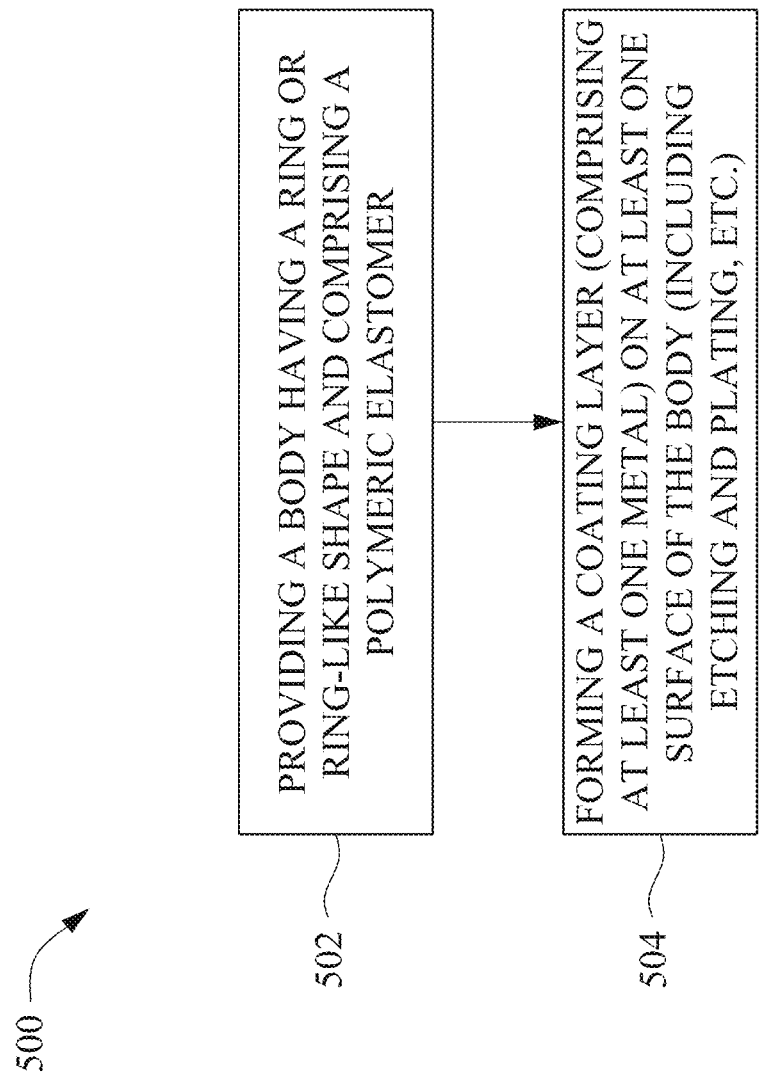
FIG. 5 is a flow chart illustrating an exemplary method for making a sealing article in accordance with some embodiments.

Referring to FIG. 5, the present disclosure provides an exemplary method 500 of making the exemplary sealing article 212 or 232 as described. The exemplary method 500 comprises steps 502 and 504.

At step 502, a body 214 (or 234) having a ring or ring-like or any other suitable shape and comprising a polymeric elastomer is provided. As described above, the polymeric elastomer in the body 214 (or 234) comprises or is made of perfluoroelastomer, fluoroelastomer or a combination thereof. The body 214 (or 234) is provided by molding and curing a polymeric elastomer, for example, using a compression molding technique at an elevated temperature.

At step 504, a coating layer 216 (or 236) is formed on at least one surface of the body 214 (or 234). The coating layer 216 (or 236) comprises or is made of at least one metal or a metal-containing material such as a ceramic.

The at least one metal in the coating layer 216 (or 236) may be aluminum, copper, gold, silver, or any combinations thereof. The coating layer 216 (or 236) may be formed using a suitable process such as sputtering, electroplating, plastic plating and electroless plating. Before the coating layer 216 (or 236) is formed, the surface of at least the portion to be coated or the whole body 214 (or 234) is chemically or physically etched. Such an etching process provides pores or holes on the surface, and the at least one metal can penetrate into the pores or holes to provide higher adhesion between the body 214 (or 234) and the coating layer 216 (or 236)

Figure 6A:
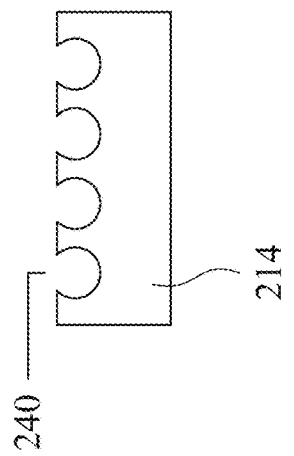
FIGS. 6A-6D are cross-sectional views illustrating an exemplary method for making a sealing article using an electroless plating technique in accordance with some embodiments.

Referring to FIGS. 6A-6D, an exemplary process for step 504 is used in some embodiments. In FIGS. 6A-6D, only a portion of a sealing article being fabricated is illustrated. The body 214 (or 234) has a cross-section in a semi-circular, circular, semi-elliptical or elliptical shape, or any other suitable shape. The at least one surface of the body 214 (or 234) is first etched using an acid or other suitable chemicals to provide pores or holes 240 on the surface. After etched, the body 214 is rinsed with water. The resulting structure is illustrated in FIG. 6A. The metal-containing coating layer 216 will subsequently penetrate into the pores or holes 240 for enhancing bonding between a top surface of the body 214 and the coating layer 216. The etched area is a predetermined area for subsequently forming the coating layer 216. For example, the etched area is a top surface of the body 214, which may be a flat surface of the semi-circular or semi-elliptical shape, or the entire external surface of the body 214 when the body 214 has a circular or elliptical shape.

Figure 6B:
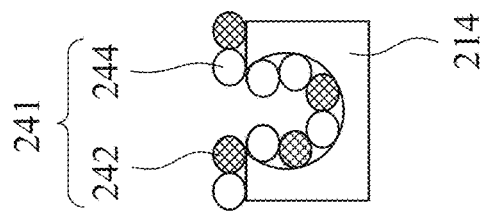
Figure 6C:
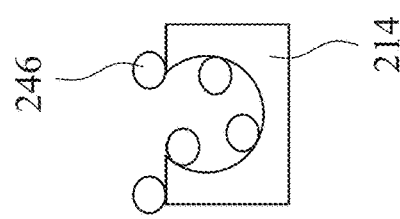

Referring to FIG. 6B, a catalyst 241 is optionally applied onto the surface of the body 214. Examples of a suitable catalyst include, but are not limited to Sn metal or ions 242, Pd metal or ions 244, and any combinations thereof. After the catalyst 241 is applied, the sample is rinsed with water. An accelerator 246 may be also optionally applied onto the surface to be coated. The resulting structure is illustrated in FIG. 6C.

Figure 6D:
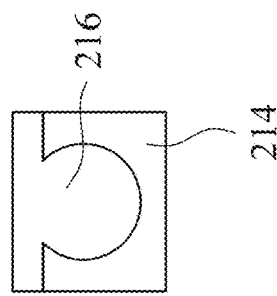

A metal such as aluminum and nickel can be coated on to the surface of the body 214 through a suitable method such as an electroless or plastic coating technique. Electroless plating is an auto-catalytic reaction used to deposit a coating of a metal on a substrate. Unlike electroplating, it is not necessary to pass an electric current through the solution to form a deposit. Electroless plating of aluminum or nickel can be performed at room temperature from a precursor in a solvent or solution, which may be aqueous or non-aqueous. For example, electroless plating of aluminum can be performed using an organic aluminum-containing precursor in an ionic liquid, other than an aqueous solution. The resulting structure is illustrated in FIG. 6D. As illustrated in FIG. 6D, the coating layer 216 is formed on a top surface of the body 214, with interpenetration into the surface by filling the pores or holes 240.

Figure 7:
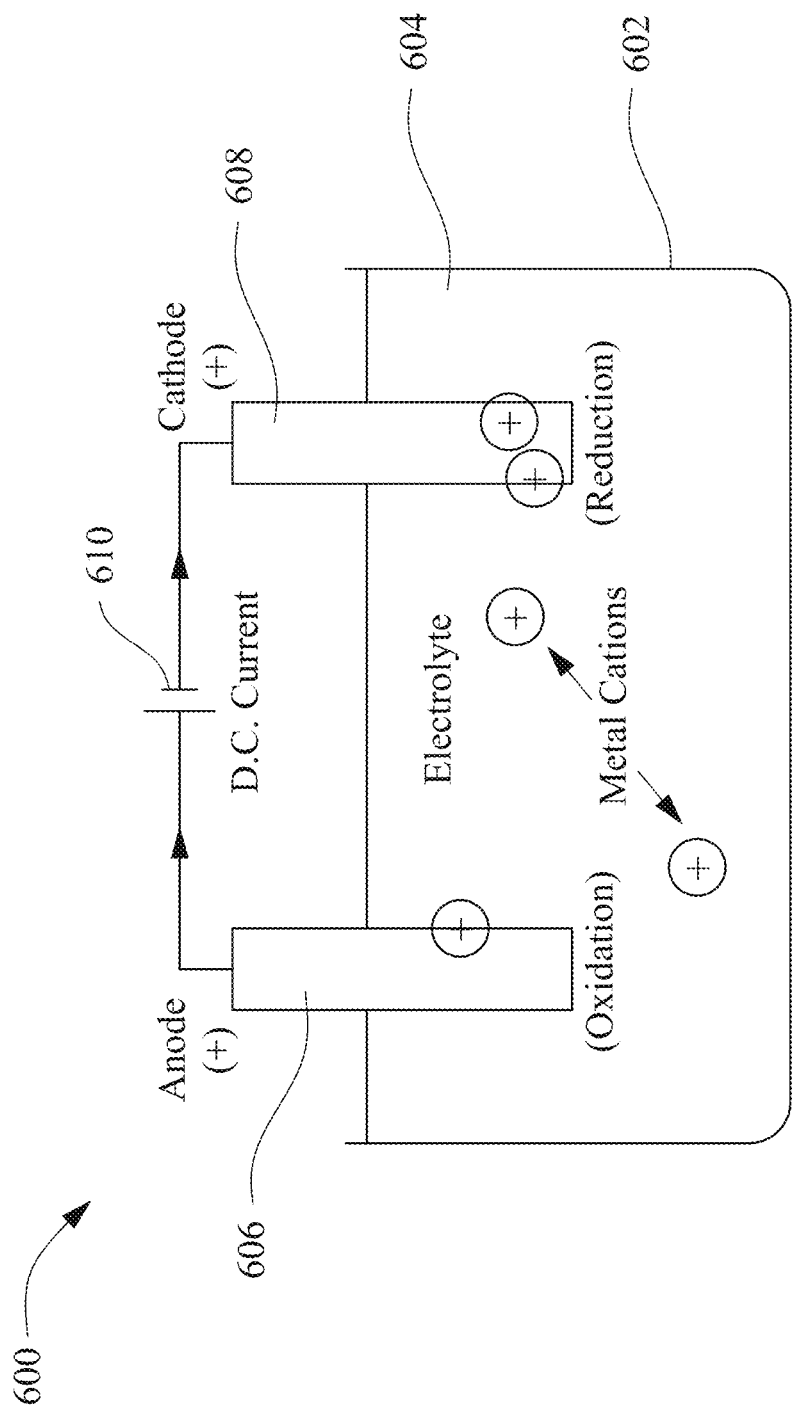
FIG. 7 illustrates an exemplary method for making a sealing article using an electroplating technique in some embodiments.

In some other embodiments, referring to FIG. 7, an electroplating method can be used to form the coating layer 216. After any optional pre-treatment of the body 214 (FIGS. 6A-6C), the body 214 may contain a small amount of metal on the surface. The body 214 can be coated using an electroplating apparatus 600, which includes an electroplating batch 602, an aqueous metal ion solution 604, electrodes 606 and 608, and a battery 610.

Referring to FIG. 8, the present disclosure also provides an exemplary method 800 of using the exemplary sealing article 212 (or 232). The exemplary method 800 comprises at least step 802, and optionally steps 804 and 806.

At step 802, the sealing article 212 (or 232) is installed in a semiconductor processing chamber 200. The sealing article 212 (or 232) may be used in any location requiring sealing. The coating layer 216 may be disposed above the semiconductor substrate 206. The side with the coating layer 216 may face away from the semiconductor substrate 206. In the exemplary processing chamber 200, at least one surface of the body 214 with the coating layer 216 faces upward toward the radiation source 209.

At step 804, ultra violet (UV) light is provided from a radiation source 209 disposed on a top portion of the semiconductor processing chamber 200. The UV has a wavelength in a range of from 10 nm to 400 nm, for example, from 200 nm to 300 nm. The coating layer 216 comprising at least one metal can reflect, deflect or absorb UV, and/or insulate the body 214 from exposure to UV. So the polymer chains in the body 214 are kept intact during a UV process. Examples of the processes with UV include, but are not limited to, the processes for forming a contact etch stopper layer (CESL), extra low k dielectrics (ELK), and low k dielectrics (LK).

At step 806, plasma is optionally provided to the semiconductor processing chamber 200, and the semiconductor processing chamber 200 is optionally heated to an elevated temperature (e.g., up to 300, 350, or 380° C.). Step 806 may be before or after step 804. The power of the plasma is very high in some embodiments, for example, in a range of from 300 watts to 9,000 watts (e.g., from 3,000 watts to 9,000 watts). The sealing article 212 or 232 described herein have the characteristics suitable for use in semiconductor plasma and gas chemical vapor deposition (CVD) applications including high density plasma CVD (HDPCVD), plasma-enhanced CVD (PECVD) and atomic layer deposition (ALD) and plasma-enhanced atomic layer deposition (PEALD). The coating layer 216 comprising at least one metal can deflect or absorb plasma, and/or protect the body 214 from degradation by plasma.

The sealing article 212 or 232 described herein is metallized and provides good sealing forces, and has excellent resistance to UV and plasma. The sealing article 212 or 232 also has high temperature resistance, chemical resistance, and high purity. The sealing article has a long service life without causing any chemical or particulate contaminations after repeatedly exposed to UV, plasma and other harsh environments.

The present disclosure provides a sealing article comprises a body and a coating layer disposed on at least one surface of the body. The body has a ring or ring-like shape and comprises a polymeric elastomer. The body may also have an elongated shape and then joined or spliced to form a ring or ring-like shape. The coating layer comprises at least one metal or a metal-containing material such as ceramic. The polymeric elastomer in the body is selected from perfluoroelastomer, fluoroelastomer, or combinations thereof. The at least one metal in the coating layer is selected from the group consisting of aluminum, copper, gold, silver, and combinations thereof. In some embodiments, the coating layer is made of aluminum. The coating layer has a suitable thickness, for example, in a range of from 10 micrometers to about 10,000 micrometers. The sealing article is selected from the group consisting of a seal, a gasket, an O-ring, a T-ring, and any combination thereof. In some embodiments, the sealing article is in a loop configuration, or is sized and shaped to provide a loop configuration, extending along the elongated shape of the body.

In some embodiments, the body has a cross-section in a semi-circular or semi-elliptical shape. The cross-section is perpendicular to a direction along the body (e.g., having a ring shape or an elongation shape). The coating layer is disposed on a top surface of the body. The top surface of the body coated with the coating layer may be a flat surface of the semi-circular or semi-elliptical shape.

In some embodiments, the body has a cross-section in a circular or elliptical shape, and the coating layer is disposed on and partially or fully covers an external surface of the body.

In another aspect, the present disclosure provides a method of making a sealing article. The method comprises steps of: providing a body having an elongated shape and comprising a polymeric elastomer, and forming a coating layer on at least one surface of the body, the coating layer comprising at least one metal. The polymeric elastomer in the body is selected from the group consisting of perfluoroelastomer, fluoroelastomer and combinations thereof. The body is provided by molding and curing a polymeric elastomer. The at least one metal in the coating layer is selected from the group consisting of aluminum, copper, gold, silver, and combinations thereof. The coating layer may be formed using a suitable process such as sputtering, electroplating, plastic plating and electroless plating. In some embodiments, the step of forming the coating layer comprises a step of etching the at least one surface of the body using an acid. The etching step improves bonding between a top surface of the body and the coating layer. In some embodiments, the body has a cross-section in a semi-circular or semi-elliptical shape. The coating layer is formed on a top surface of the body. The top surface of the body is a flat surface of the semi-circular or semi-elliptical shape. In some other embodiments, the body has a cross-section in a circular or elliptical shape. The coating layer is formed on and partially or fully covers an external surface of the body.

In another aspect, the present disclosure provides a method of using a sealing article. Such a method comprises a step of installing the sealing article in a semiconductor processing chamber. In some embodiments, such a method further comprises providing ultra violet (UV) light from a radiation source disposed on a top portion of the semiconductor processing chamber. At least one surface of the body with the coating layer faces upward toward the radiation source. In some embodiments, the method of using further comprises providing plasma to the semiconductor processing chamber, and heating the semiconductor processing chamber to an elevated temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sealing article, comprising:
a body made of a polymeric elastomer comprising perfluoroelastomer (FFKM), and
a coating layer disposed on a top surface of the body, the coating layer comprising at least one metal,
wherein the body has a whole cross-section in a semi-circular or semi-elliptical shape, the top surface of the body is a flat surface, and the coating layer is a layer disposed on the flat surface of the body only,
wherein the body defines pores on the flat surface, and the at least one metal penetrates into the pores, and
wherein the coating layer on the top surface of the body is configured to face toward radiation in a semiconductor processing chamber and reflect or absorb the radiation.

2. The sealing article of claim 1, wherein the polymeric elastomer further comprises a fluoroelastomer.

3. The sealing article of claim 1, wherein the at least one metal in the coating layer is selected from the group consisting of aluminum, copper, gold, silver, and combinations thereof.

4. The sealing article of claim 1, wherein the coating layer is made of aluminum.

5. The sealing article of claim 1, wherein the coating layer has a thickness in a range of from 10 micrometers to about 10,000 micrometers.

6. The sealing article of claim 1, wherein the sealing article is selected from the group consisting of a seal, a gasket, an O-ring, and a T-ring, and is in a loop configuration or is sized and shaped to provide a loop configuration extending along an elongated shape of the body.

7. A sealing article, comprising:
a body made of a polymeric elastomer comprising perfluoroelastomer (FFKM), wherein the FFKM comprises a copolymer, and
a coating layer disposed on a top surface of the body, the coating layer comprising at least one metal,
wherein the body has a whole cross-section in a semi-circular or semi-elliptical shape, the top surface of the body is a flat surface, and the coating layer is a layer disposed on the flat surface of the body only,
wherein the body defines pores on the flat surface, and the at least one metal penetrates into the pores, and
wherein the coating layer on the top surface of the body is configured to face toward radiation in a semiconductor processing chamber and reflect or absorb the radiation.

8. The sealing article of claim 7, wherein the copolymer comprises perfluoro(alkyl vinyl ether), tetrafluoroethylene, and a cure site monomer.

9. The sealing article of claim 7, wherein the polymeric elastomer further comprises fluoroelastomer.

10. The sealing article of claim 7, wherein the at least one metal in the coating layer is selected from the group consisting of aluminum, copper, gold, silver, and combinations thereof.

11. The sealing article of claim 7, wherein the coating layer has a thickness in a range of from 10 micrometers to about 10,000 micrometers.

12. The sealing article of claim 7, wherein the sealing article is selected from the group consisting of a seal, a gasket, an O-ring, and a T-ring, and is in a loop configuration or is sized and shaped to provide a loop configuration extending along an elongated shape of the body.

13. A sealing article, comprising:
a body made of a polymeric elastomer comprising perfluoroelastomer, wherein the perfluoroelastomer comprises a filler, and
a coating layer disposed on a top surface of the body, the coating layer comprising at least one metal,
wherein the body has a whole cross-section in a semi-circular or semi-elliptical shape, the top surface of the body is a flat surface, and the coating layer is a layer disposed on the flat surface of the body only, wherein the body defines pores on the flat surface, and the at least one metal penetrates into the pores, and wherein the coating layer on the top surface of the body is configured to face toward radiation in a semiconductor processing chamber and reflect or absorb the radiation.

14. The sealing article of claim 13, wherein the filler comprises perfluorotetrafluoroethylene (PFTE).

15. The sealing article of claim 13, wherein the polymeric elastomer further comprises fluoroelastomer.

16. The sealing article of claim 13, wherein the at least one metal in the coating layer is selected from the group consisting of aluminum, copper, gold, silver, and combinations thereof.

17. The sealing article of claim 13, wherein the coating layer has a thickness in a range of from 10 micrometers to about 10,000 micrometers.

18. The sealing article of claim 13, wherein the sealing article is selected from the group consisting of a seal, a gasket, an O-ring, and a T-ring, and is in a loop configuration or is sized and shaped to provide a loop configuration extending along an elongated shape of the body.

* * * * *